United States Patent
Forman et al.

(10) Patent No.: US 7,116,257 B1
(45) Date of Patent: Oct. 3, 2006

(54) LOW NOISE DIGITAL TO ANALOG CONVERTER WITH AUDIO APPLICATIONS

(75) Inventors: Dustin D. Forman, Kelowna (CA); A. Martin Mallinson, Kelowna (CA); Simon Damphousse, Kelowna (CA)

(73) Assignee: ESS Technology, Inc., Fremont, CA (US)

(*) Notice: Subject to any disclaimer, the term of this patent is extended or adjusted under 35 U.S.C. 154(b) by 0 days.

(21) Appl. No.: 11/236,216

(22) Filed: Sep. 26, 2005

(51) Int. Cl.
*H03M 1/66* (2006.01)

(52) U.S. Cl. ...................... 341/144; 341/143

(58) Field of Classification Search ......... 341/120–170
See application file for complete search history.

(56) References Cited

U.S. PATENT DOCUMENTS

| | | |
|---|---|---|
| 5,559,467 A | 9/1996 | Smedley |
| 5,903,871 A | 5/1999 | Terui et al. |
| 5,974,089 A | 10/1999 | Tripathi et al. |
| 6,137,429 A * | 10/2000 | Chan et al. .............. 341/143 |
| 6,208,279 B1 | 3/2001 | Oprescu |
| 6,344,811 B1 | 2/2002 | Melanson |
| 6,466,087 B1 | 10/2002 | Ruha |
| 6,504,427 B1 | 1/2003 | Midya et al. |
| 6,594,309 B1 | 7/2003 | Botti et al. |
| 6,768,437 B1 * | 7/2004 | Ruotsalainen et al. ...... 341/143 |
| 6,794,930 B1 | 9/2004 | Nurminen |
| 6,795,004 B1 | 9/2004 | Masuda et al. |

2004/0165661 A1  8/2004  Braun

OTHER PUBLICATIONS

Jorge Varona, "Power Digital-to-Analog Conversion Using Sigma-Delta and Pulse Width Modulations," ECE1371 Analog Electronics II, ECE University of Toronto, pp. 1-14, 2001, no month.

Erik Bresch and Wayne T. Padgett, "TMS320C67-Based Design of a Digital Audio Power Amplifier Introducing Novel Feedback Strategy," Rose-Hulman Institute of Technology, Electrical and Computer Engineering Department, pp. 1-16, 1999, no month.

K. P. Sozanski, R. Strzelecki and Z. Fedyczak, "Digital Control Circuit for Class-D Audio Power Amplifier," Power Electronics Specialists Conference, PESC 2001 IEEE 32nd Annual, vol. 2, pp. 1245-1250, 2001, no month.

Morten Johansen and Karsten Nielsen, "A Review and Comparison of Digital PWM Methods for Digital Pulse Modulation Amplifier (PMA) Systems," 107th Convention of Audio Engineering Society, Sep. 24-27, 1999, New York, New York.

Thomas Taul, Karsten Nielsen and Michael A.E. Andersen, "Comparing Nonlinear with Linear Control Methods for Error Correction in Switching Audio Amplifier Output Stages," 104th Convention of Audio Engineering Society, May 16-19, 1998, Amsterdam.

Karsten Nielsen, "MECC—A Novel Control Method for High End Switching Audio Power Amplification," 105th Convention of Audio Engineering Society, Sep. 26-29, 1998, San Francisco, California.

(Continued)

*Primary Examiner*—Lam T. Mai
(74) *Attorney, Agent, or Firm*—Ernest J. Beffel, Jr.; Haynes Beffel & Wolfeld LLP

(57) ABSTRACT

The present invention relates to multi-bit to pulse width modulated signal conversion, with extensions to digital-to-analog conversion. In particular, it has application to conversion of pulse code modulated signals, such as used in CDs and DVDs, to audio output.

15 Claims, 5 Drawing Sheets

OTHER PUBLICATIONS

Crilles Bak Rasmussen, "Hybrid Digital-Analog Feedback Audio Amplifiers," 2004 Dissertation, in cooperation with Bang & Olufsen ICEpower A/A, Lyngby 2004, Eksamensprojekt, NR. IMM-Thesis-2004-68, no month.

M. O. J. Hawksford, "Time-Quantized Frequency Modulation, Time-Domain Dither, Dispersive Codes, and Parametically Controlled Noise Shaping in SDM," J. Audio Eng. Soc., vol. 52, No. 6, pp. 587-617, Jun. 2004.

D. Weiler, P.A. Nielsen, D. Hammerschmidt, O. Machul and B. J. Hosticka, "Single Bit Sigma-Delta Modulator with Nonlinear Quantization for μ-Law Coding," 23rd European Sold-State Circuits Conference, Southhampton, United Kingdom, Sep. 16-18, 1997.

D. Akselrod, S. Greenberg, S. Hava and V. Koifman, "Noise-Shaped Dynamic Element Matching Architecture for Multibit Delta-Sigma Converters," Accepted for publication in: Proceedings of Communication Systems, Networks and Digital Signal Processing, Jul. 2002.

E. Bach, "Mulibit Oversampling D/A Converters Using Dynamic Element Matching Methods," Siemens AG, Semiconductors Group, Mar. 3, 1999.

E. Fogelman, "A Dynamic Element Matching Technique for Reduced-Distortion Mulitbit Quantization in Delta-Sigma ADCs," IEEE Transactions on Circuits and Systems-II: Analog and Digital Signal Processing, vol. 48, No. 2, Feb. 2001.

Y. Geerts and M. Steyaert, "Guidelines for Implementation of CMOS Multibit Oversampling Modulators," K.U. Leuven, ESAT-MICAS, Jan. 1999.

H. Jensen, "A Low-Complexity Dynamic Element Matching DAC for Direct Digital Synthesis," IEEE Transactions on Circuits and Systems-II: Signal Processing, vol. 45, No. 1, Jan. 1998.

* cited by examiner

```
// -*- Mode: Verilog -*-
module bit_revolver_v2 (clk,clken,reset,in,out);
parameter SIZE = 6;
parameter
5 REV_SIZE = 64;
parameter RI = REV_SIZE - 1;
parameter MI = SIZE - 1;

input clk;
10 input clken;
   input reset;
   input [MI:0] in;
   output [RI:0] out;

15 reg [MI:0] in_d;
   reg [MI:0] tail;
   reg ping;

wire [MI:0] in_diff = in - in_d;
20 wire [MI:0] head = tail + in_d;
   wire and_or = (head >= tail)? 1:0;

always @(posedge clk or posedge reset)
      begin
25    if (reset)
         begin
           in_d <= 0;
           tail <= 0;
           ping <= 0;
30       end
      else if (clken)
         begin
           in_d <= in;
           casex({ping,in_diff})
35         //ping = 0 and rotate clockwise by 1 (64 outputs)
           {1'b0,6'd3} :begin tail<=tail-1;ping<=1;end//+3
           {1'b0,6'd2} :begin tail<=tail+0;ping<=1;end//+2
           {1'b0,6'd1} :begin tail<=tail+0;ping<=1;end//+1
           {1'b0,6'd0} :begin tail<=tail+1;ping<=1;end// 0
40         {1'b0,6'd63}:begin tail<=tail+1;ping<=1;end//-1
```

FIG. 1A

```
                {1'b0,6'd62}:begin tail<=tail+2;ping<=1;end//-2
                {1'b0,6'd61}:begin tail<=tail+2;ping<=1;end//-3
                //ping = 1 and rotate clockwise by 1
                {1'b1,6'd3} :begin tail<=tail+0;ping<=0;end//+3
45              {1'b1,6'd2} :begin tail<=tail+0;ping<=0;end//+2
                {1'b1,6'd1} :begin tail<=tail+1;ping<=0;end//+1
                {1'b1,6'd0} :begin tail<=tail+1;ping<=0;end// 0
                {1'b1,6'd63}:begin tail<=tail+2;ping<=0;end//-1
                {1'b1,6'd62}:begin tail<=tail+2;ping<=0;end//-2
50              {1'b1,6'd61}:begin tail<=tail+3;ping<=0;end//-3
                default begin tail<=tail+1; end//all others
              endcase
            end
          end
55
       wire [63:0] h,t;

assign h[0 ] = (head >= 6'd0)? 1:0;
       assign h[1 ] = (head >= 6'd1)? 1:0;
60     assign h[2 ] = (head >= 6'd2)? 1:0;

***
       assign h[60] = (head >= 6'd60)? 1:0;
       assign h[61] = (head >= 6'd61)? 1:0;
       assign h[62] = (head >= 6'd62)? 1:0;
       assign h[63] = (head >= 6'd63)? 1:0;
65
       assign t[0 ] = (tail < 6'd0)? 1:0;
       assign t[1 ] = (tail < 6'd1)? 1:0;

***
70     assign t[60] = (tail < 6'd60)? 1:0;
       assign t[61] = (tail < 6'd61)? 1:0;
       assign t[62] = (tail < 6'd62)? 1:0;
       assign t[63] = (tail < 6'd63)? 1:0;

75
       assign out = (and_or)? h&t : h|t;
       endmodule // bit_revolver_v2
```

FIG. 1B

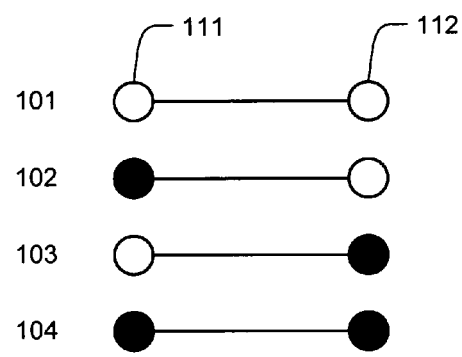

LOW NOISE DIGITAL TO ANALOG CONVERTER WITH AUDIO APPLICATIONS

RELATED APPLICATION

This application is related to U.S. patent application Ser. No. 10/621,504 filed Jul. 17, 2003 by Martin Mallinson, entitled "Device and Method for Signal Processing," which was at the time of both inventions obligated to be assigned to the same organization as this application. It is further related to a contemporaneously filed U.S. patent application Ser. Nos. 11/236,215 entitled "Low Noise Digital to Pulse Width Modulated Converter with Audio Applications" filed Sep. 26, 2005 by inventors Martin Mallinson, Dustin Forman and Simone Damphousse, and 11/236,205 entitled "Low Noise Digital to Signal Interval Converter with Audio Applications" filed Sep. 26, 2005 by inventors Simone Damphousse, Martin Mallinson and Dustin Forman. The related applications are incorporated by reference.

COPYRIGHT NOTICE

FIGS. 1A–B of the disclosure of this patent document contains Verilog code that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

The present invention relates to multi-bit to pulse width modulated signal conversion, with extensions to digital-to-analog conversion. In particular, it has application to conversion of pulse code modulated signals, such as used in CDs and DVDs, to audio output.

Audio fidelity depends in part on the signal to noise ratio (SNR) of the digital-to-analog (D/A) converter used. This converter may be part of a CD player, located on a sound card or included with powered speakers that are digitally driven. Manufacturers compete on the basis of the SNR achieved by their equipment. For instance, Creative Labs currently (in September 2005) advertises the Audigy Pro 4 sound card as achieving an SNR of 113 decibels in some modes.

An additional consideration in D/A conversion, or in any digital design, is simplicity. The fewer gates required to produce a high fidelity decoder, the better. Accordingly, an opportunity arises for new digital designs, especially digital designs that achieve strong signal-to-noise ratios.

SUMMARY OF THE INVENTION

The present invention relates to multi-bit to pulse width modulated signal conversion, with extensions to digital-to-analog conversion. In particular, it has application to conversion of pulse code modulated signals, such as used in CDs and DVDs, to audio output. Particular aspects of the present invention are described in the claims, specification and drawings.

BRIEF DESCRIPTION OF THE DRAWINGS

FIGS. 1A–1B include Verilog code for D/A conversion that can be applied to an oversampled audio input signal or, more generally, to any multi-bit input signal.

FIG. 2 depicts and defines alternative containment relationships.

FIG. 4 provides additional details of one logic block that can implement FIG. 3.

DETAILED DESCRIPTION

Figure 3:
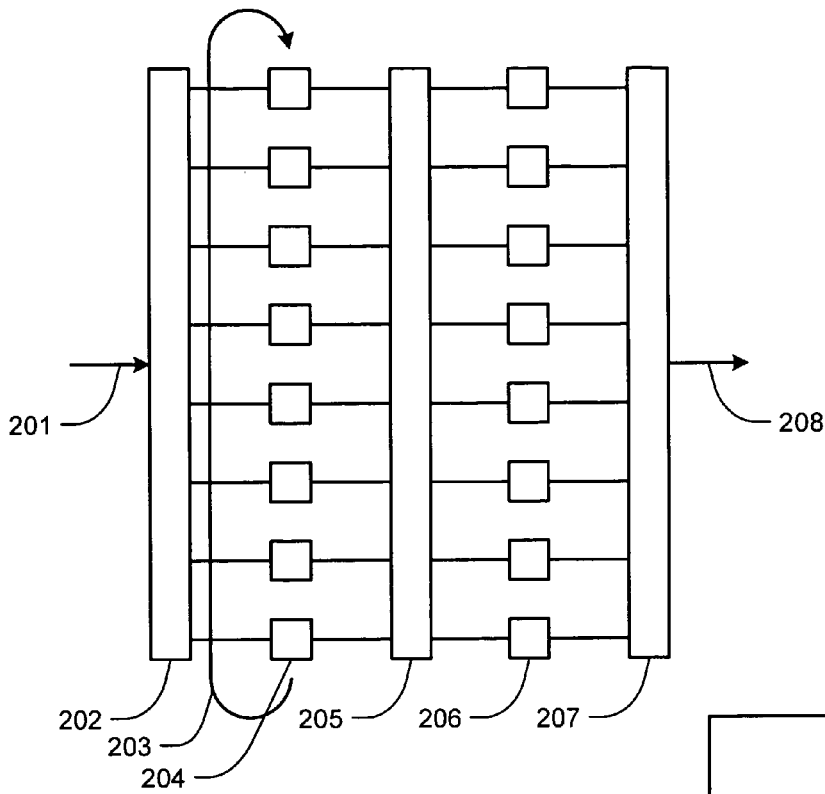
FIGS. 3–4 depict a second, more abstract embodiment, including a circularly linked ordered set of elements.

The following detailed description is made with reference to the figures. Preferred embodiments are described to illustrate the present invention, not to limit its scope, which is defined by the claims. Those of ordinary skill in the art will recognize a variety of equivalent variations on the description that follows.

First Embodiment

The first embodiment is described with reference to FIGS. 1A–1B, which include Verilog code for D/A conversion that can be applied to an oversampled audio input signal or, more generally, to any multi-bit input signal. Referring to the application incorporated by reference, the reader will understand that a Sigma Delta modulator can be used to convert a wide-bit pulse code modulated signal at a first sampling rate, such as a 16-bit signal at 44.1 kHz, to a multi-bit signal of less precision and faster sampling rate, such as a 6-bit signal at faster than 1 MHz. The Verilog code in FIG. 1A–1B is readily applied to a 6-bit input signal at about 1 MHz. It also could be applied to a 48 or 96 kHz signal oversampled to 1 MHz or another rate. Most generally, it can be applied to any multi-bit input signal.

The initial parameters in FIG. 1A, defined beginning at line 4 include SIZE, which specifies the bit width of the input signal, and REV_SIZE, which specifies the number of discrete values generated by an input signal SIZE bits wide. In this example, a 6-bit wide signal represents 64 discrete values. Oversamplers use the full range available in the input signal, but one could imagine using less than the full range or ignoring the extremes of the range and not treating them as valid values. The parameters MI and RI are each one less than the preceding parameters, for use in a range from zero to MI or RI, inclusive.

The bit revolver module operates on four input signals to produce one output signal, defined beginning at line 9. The input signals are clock, clock enable, reset and a multi-bit input signal "in". The output is a 64-bit signal "out". In some applications, each bit is used to drive a different single-bit D/A converter. In this disclosure, "D/A converter" may include a resistor that makes the signal ready for capacitive smoothing. Alternatively, an RC circuit or other element that modifies the waveform of a signal may function as a D/A converter.

Beginning at line 15, registers are defined for in_d, which is an input signal delayed by one clock cycle, tail, which is an indicator for one end of a bit string that will be generated as the out signal, and ping, which is used in this embodiment to switch between responding to changes in the value of the input signal by adding or removing odd bits from the head or tail of the bit string being generated as the out signal. In another embodiment, the bit string might always be lengthened by adding bits the tail of the string and removing bits from the head of the string, or vice versa. One could always add and remove bits from the string at just the head or tail, with occasional high-frequency artifacts when the signal repeatedly fluctuated by +/−2 or more while the bit string was rotating only 1 position per clock cycle. Such high frequency noise artifacts could be removed by a low pass filter. The registers defined hold unsigned integers.

Lines 19–21 specify combinatorial logic, which operates very quickly, without waiting for the rising or falling edge of a clock signal. A calculated difference between values of the current input signal and the previous input signal is in_diff. A head indicator is calculated as the position of the tail indicator plus the value of the previous (or current) input signal. A logical bit "and_or" is calculated to indicate whether the head indicator or the tail indicator is larger. This logical bit helps implement a circular bit string in the out signal. When the tail indicator is smaller than the head indicator, the bit string contained between head and tail indicators corresponds to the value of the input signal; when the head is smaller than the tail, the bit string between the head and tail indicators is the complement of the bit string that corresponds to the value of the input signal, because the bit string has wrapped from one end of the queue to the other. The name "and_or" should alert the reader that, in this embodiment, AND logic will be applied when the head indicator is greater than or equal to tail indicator and OR logic will be applied otherwise.

For completeness, we point out the four alternative "containment relationships" that can be illustrated by segments with endpoints that are open or closed circles, as in FIG. 2. In 101, the segment is contained between head 112 and tail 111 for values between the indicators. In 102, values between the indicators or equal to the tail 111 are contained. In 103, values between the indicators or equal to the head 112 are contained. In 104, the values between or equal to either the head or tail are contained.

A case statement begins at line 23 and extends to line 54. In this block, registers are reloaded on the positive edge of a clock or reset signal. Logic operates combinatorially between clocks. When a reset is received, the three registers defined beginning at line 15 are initialized. Otherwise, beginning at line 31, if the clock is enabled, on clock edges the old input value is buffered to the in_d register and the new input value is the "in" signal. An extended case statement responds to the values of register ping and the combinatorially generated signal in_diff. A relatively small number of cases need to the individually handled, according to simulation studies. In simulations of oversampling an input signal to a maximum (audible) frequency of about 20 kHz, it was observed that input signal values varied from one clock signal to the next by 3 or less. By far, more differences in the range of +/−0–2 were observed than at the extreme difference of 3. No instances of a difference of 4 were observed for this input frequency and over sampling rate. For other combinations of maximum relevant input signal frequency and over sampling rate, it would be prudent to simulate the signal-to-signal variance and define the case logic accordingly.

The ping parameter in line 34 determines whether the output bit string will grow or shrink more at the tail (when ping equals one) or at the head (when ping equals zero.) "Ping" is aptly named, because the value of this register alternates between zero and one. Regardless of the value of ping, when the change in input value from one clock cycle to the next is an even number, the head and tail grow or shrink evenly. One can readily imagine other patterns for changing the length of the output bit string.

For all values of ping, the output signal bit string defined by head and tail indicators rotates one position clockwise with each clock signal. As indicated above, the length of the output bit string and the resulting head position are combinatorially calculated from the signal "in" and the registers tail and in_d. In line 36, if the input signal value increases by three in one clock cycle, the tail moves back one position and the head moves forward two positions. In effect, the output signal bit string rotates one position clockwise, adds two positions to the tail and one position to the head of the string. Similarly, in line 37, if the input signal value increases by two in one clock signal, the tail remains stationary and the head moves forward two positions, which has the effect of rotating the output string one position clockwise and adding one position to each of the head and tail. Overflow is ignored, wrapping an indictor from position 63 back to position 0, for instance. Because the logic handles unsigned integers, adding a decimal value of 63 produces the same result in modulo 64 arithmetic as subtracting −1. Case statements are provided for instances in which the input value increases or decreases by as much as 3. The case statement ends at line 54.

Excerpts from the combinatorial logic for constructing an output bit string are found at lines 56 through 77. In line 56, signals h, t are combinatorially generated with as many positions as there are allowable discrete values for the input signal. A separate assign statement populates each position of h and t. For instance, at line 58, a low order bit h[0] is set to one if the head indicator is greater than or equal to 0, which will always be true for unsigned integers. In line 65, a high order bit h[63] is set to one only if the head indicator is equal to 63. Only seven assign statements for h are shown in the figure; in the full code, there is an assign statement for each bit of h. The assign statement for t, at lines 68 through 74 operates similarly.

The output signal is combinatorially generated from the combinatorially generated h and t strings with attention to a wraparound condition that is indicated when the tail indicator is larger than the head indicator. If the head is greater than the tail, a bit string representing the value the input signal is generated by a logical AND of h & t. If the tail is greater than the head, in the wraparound condition, OR logic is applied. Because the logic from lines 55 through to 77 is combinatorial, the output signal "out" is set and remains high or low until the registers are reloaded on the next clock cycle.

Each bit of the output signal "out" can be used to drive a separate D/A converter. Rotating the virtual bit string one position clockwise on each clock cycle lessens the impact of defects in the respective D/A converters, whether caused by manufacturing processes or operating conditions of the respective D/A converters. At an over sampling frequency such as 1 MHz, variations in D/A converter value, such as variations in resistance due to manufacturing or the local temperature of a resistor will produce noise at such a high frequency that a low pass filter can remove it. A capacitive element can be useful to low pass filter high-frequency noise. The resistor by itself can be considered a D/A converter producing a signal ready for capacitive smoothing, practically speaking, because capacitive smoothing is common at the input of devices that might be coupled after the resistor.

Because the voltage and current of the digital signals is low, it is common to use one or more output buffers positioned to strengthen the signal to a level practical for output.

The Verilog code in FIGS. 1A–1B generates on the order of 1500 gates, which can be implemented in a gate array, such as an FPGA, loaded into onboard memory of a signal processor, or used to produce a chip. It operates on every clock cycle without requiring delay buffers. In this embodiment, there is no feedback loop between the Sigma Delta modulator and the output of the D/A converters.

The output signals from the separate of the D/A converters can be combined by voltage, current, or charge.

In simulations, a very favorable SNR ratio of better than 140 decibels (A-weighted equivalent) was calculated using a Sigma Delta modulator to oversample a pulse code modulated signal to a 6-bit input signal, which the Verilog code processed to generate output signals using a bank of D/A converters. On the bench, using FPGA logic and discrete analog components, an SNR of 126 decibels (A-weighted) was achieved. A custom ASIC is expected to produce better results. The D/A converters were resistors. The output of the D/A converters was combined by voltage and capacitively smoothed. Capacitance can be built into the circuit or assumed to be present on the front end of a next stage, such as an audio linear amplifier.

Figure 6:
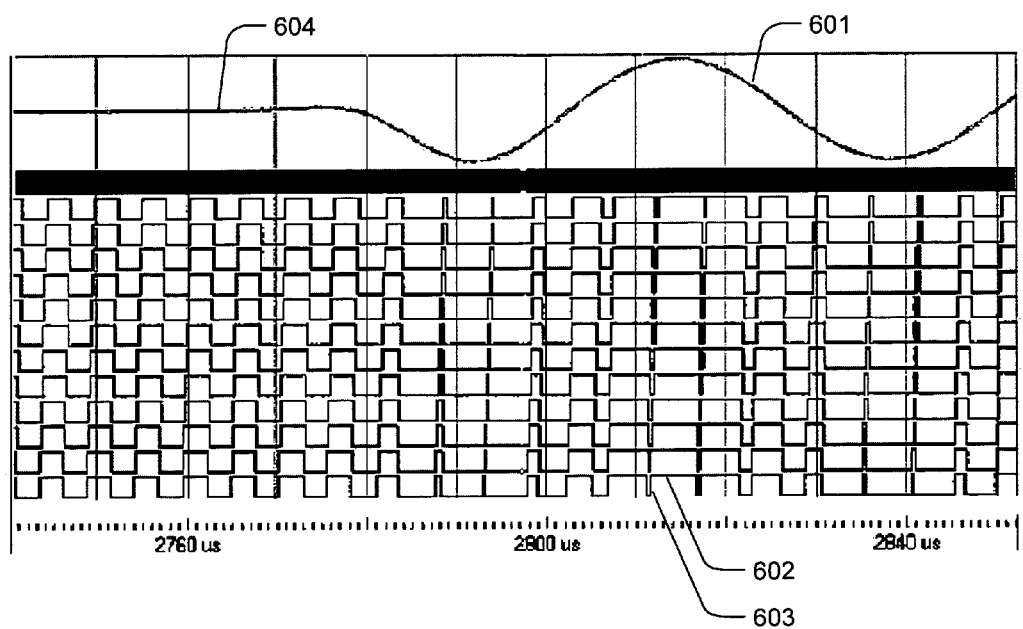
FIG. 6 depicts a part of a simulation of the Verilog code.

FIG. 6 depicts a part of a simulation of the Verilog code. A signal 601 is depicted that was generated by combining the output of 64 elements. Because there is no delay in the code and a very high SNR is achieved, the signal 601 can be taken to represent either the input or output. The output of several individual D/A converters is represented; most of the outputs have been omitted because the additional detail is unlikely to contribute to the reader's understanding. Each output stream from the Verilog code is effectively pulse width modulated, with high 602 and low 603 sections. The time between rising edges is consistent, as in a PWM signal, with potential exceptions for full range signals. In the flat section of the signal 604, the offset between PWM outputs of individual D/A converters is apparent in the traces.

Second Embodiment

Figure 4:
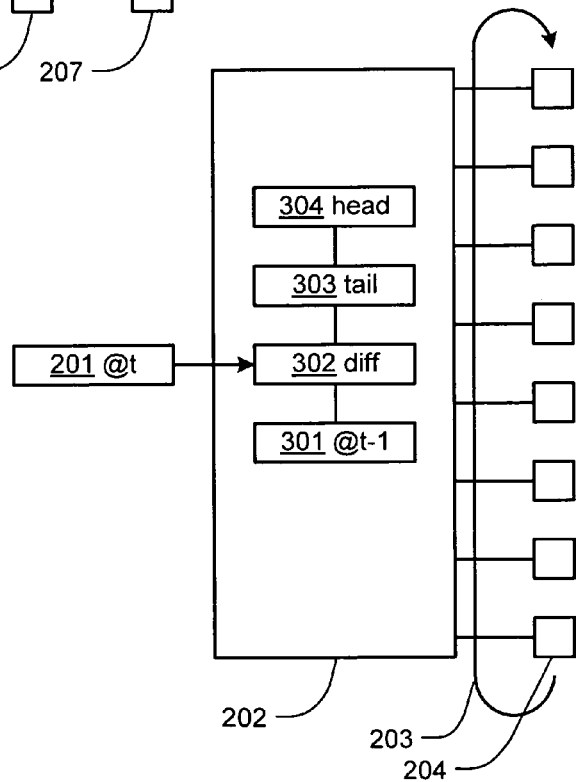

FIGS. 3–4 depict a second, more abstract embodiment. In FIG. 3, an output signal 208 is produced responsive to an input signal 201. Input signal is multi-bit digital signal. Logic 202 processes the input signal. An ordered set of elements 204 conceptually expresses the value of the input signal. In this embodiment, the ordered set is a ring 203. There at least as many elements in an ordered set as there are allowable or valid discrete values in the input signal 210. Depending on the type of containment relationship implemented in logic (see FIG. 2) it may be desirable to have one or two more elements in the ordered set than there are valid discrete values. More generally, the ordered set is not limited in size, except that it must be capable of representing a bit string corresponding to any value in the full range of the input signal. This sets a minimum size of the ordered set, not a maximum size. It typically would be desirable to just satisfy the minimum size requirement, because downstream components, such as D/A converters 206, which are proportional to the number of set elements.

The ordered set in this figure may be entirely abstract, without requiring any physical embodiment of the elements. For instance, in the first embodiment described above, a tail indicator was stored in a register and both the head indicator and difference between head and tail were derived by combinational logic; there was not any buffer storing bits corresponding to set elements; set elements were effectively expressed only in the output signal.

In some embodiments, the logic 202 that processes the input signal 201 will rotate through elements of the ordered set 204 that represent the value the input signal. Responsive to a difference between input signal values in successive clock cycles, the number of elements representing the input value is adjusted from the prior number of elements.

In other embodiments, the value of the input signal may be represented in a logical component such as a shift register. The extent of shifts in any clock period is responsive to a difference between input signal values in successive clock cycles. Then, a separate logical component, such as a barrel shifter, can be used to periodically shift the association between the bit string stored in the shift register and the ordered set elements.

Logic 205 is provided to activate D/A converters 206 to generate output signals expressing which elements in the ordered set 204 represent the value the input signal 201. A D/A converter 206 associated with an element of the ordered set 204 generates an output responsive to whether the element is currently representing part of the value of the input signal 201. The D/A converters collectively generate individual output signals that are combined 207 to produce a collective D/A converter output signal 208.

A variation on FIG. 3, such as the shift register and barrel shifter described above, might eliminate the circular property 203 of the ordered set 204 and transfer of the rotation of association between set elements 204 and D/A converters 206 from the input processing logic 202 to the D/A converter activation logic 205.

Shifting or rotation of association between elements the ordered set and the D/A converters is akin to dynamic element matching, with a recognized benefit of reducing noise due to inaccuracies in downstream components, such as the D/A converters 206. For discussions of dynamic element matching, the reader is directed to Norsworth et al., Delta-Sigma Data Converters: Theory, Design and Simulation (IEEE 1997) pp. 251–260; H. Jensen et al., A Low Complexity Dynamic Element Matching DAC for Direct Digital Synthesis, IEEE Transactions on Circuits & Systems II: Analog and Digital Signal Processing, Vol. 45, No. 1 (January 1998) pp. 13–27; and E. Bach, Multi-bit oversampling D/A Converters Using Dynamic Element Matching Methods accessed at www.imse.cnm.es/esd-msd/PUBLIC_DELIV/SYSCONV/D311.pdf on Sep. 16, 2005.

These dynamic element matching (DEM) references do not pay attention to the contribution to noise resulting from activating and deactivating D/A converters. Two sources of noise are reduced by the rotation approach that would tend to be exacerbated by many DEM approaches. First, rotation reduces the number of transitions of any individual D/A converter from low to high. Each D/A converter produces an output that resembles a pulse width modulated signal. Each D/A converter has a relatively low number of transitions. In most embodiments, particular D/A converters have an equal likelihood of being involved in transition; there is no bias that makes the performance of one D/A converter more critical than any other D/A converter. Second, reducing the number of transitions also reduces the effect of asymmetry in the rise and fall times of D/A converters. This asymmetry is believed to be a substantial noise source. Third, rotation assures a fixed frequency of edges for different input sample values. The fixed frequency of edges for different input amplitudes is considered to have the biggest impact. For example, if trying to generate –0.50 the switching frequency should be the same as trying to generate any other value. By doing this, the error in rise/fall times becomes a small DC offset (since it is constant for all inputs) in the in-versus-out plot, however, the plot will still be linear. This small DC offset will not create THD. If the amount of edges is allowed to change for various input amplitudes, then THD will be introduced since the in-versus-out plot will be non-linear. In contrast to rotation, the data weighted averaging method of DEM, championed by E. Bach and others, increases the number of transitions and the effect of asymmetry because it accelerates rotation of signal transitions through the D/A converter banks.

In alternative embodiments, various random or pseudo-random jump rotations could be used. For instance, the rotation could advance an amount dictated by a random number generator, scaled to a rotation of 1–4, 1–16, 1–32, etc. Or, the rotation could advance in proportion to the value of an input signal. These advance schemes would likely introduce some cycle(s) of delay, which is more tolerable when there is no feedback loop.

FIG. 4 provides additional details of the logic 202. The input signal 201 at time t is received and a difference 302 between signals at times t (201) and t−1 (301) is calculated. The new signal t is buffered to t−1 (301) for use on the next clock cycle. The tail indicator 303 is updated, responsive to the difference 302. The head indicator 304 is also updated. Either head or tail can be updated first; the order does not matter.

Third Embodiment

Figure 5:
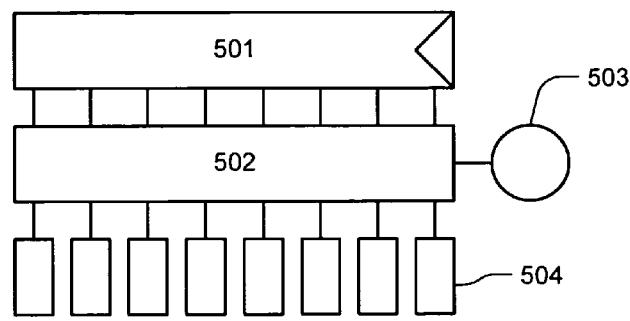
FIG. 5 is a block diagram of an embodiment using a shift register and barrel shifter coupled to a plurality of single-bit digital-to-analog (D/A) converters.

FIG. 5 depicts an alternative embodiment. A shift register 501 is populated with bits. As the difference between input signals is calculated, the bits in the register 501 are shifted one direction or the other, always adding or dropping bits from the same end of the register. The shift register is coupled to a barrel shifter 502 that rotates the association of particular bits in the shift register 501 with particular D/A converters 504. A counter, such as a ring counter 503 drives the shift logic of the barrel shifter. The front and back ends to this arrangement are as in the previous embodiments.

Fourth Embodiment

Figure 7:
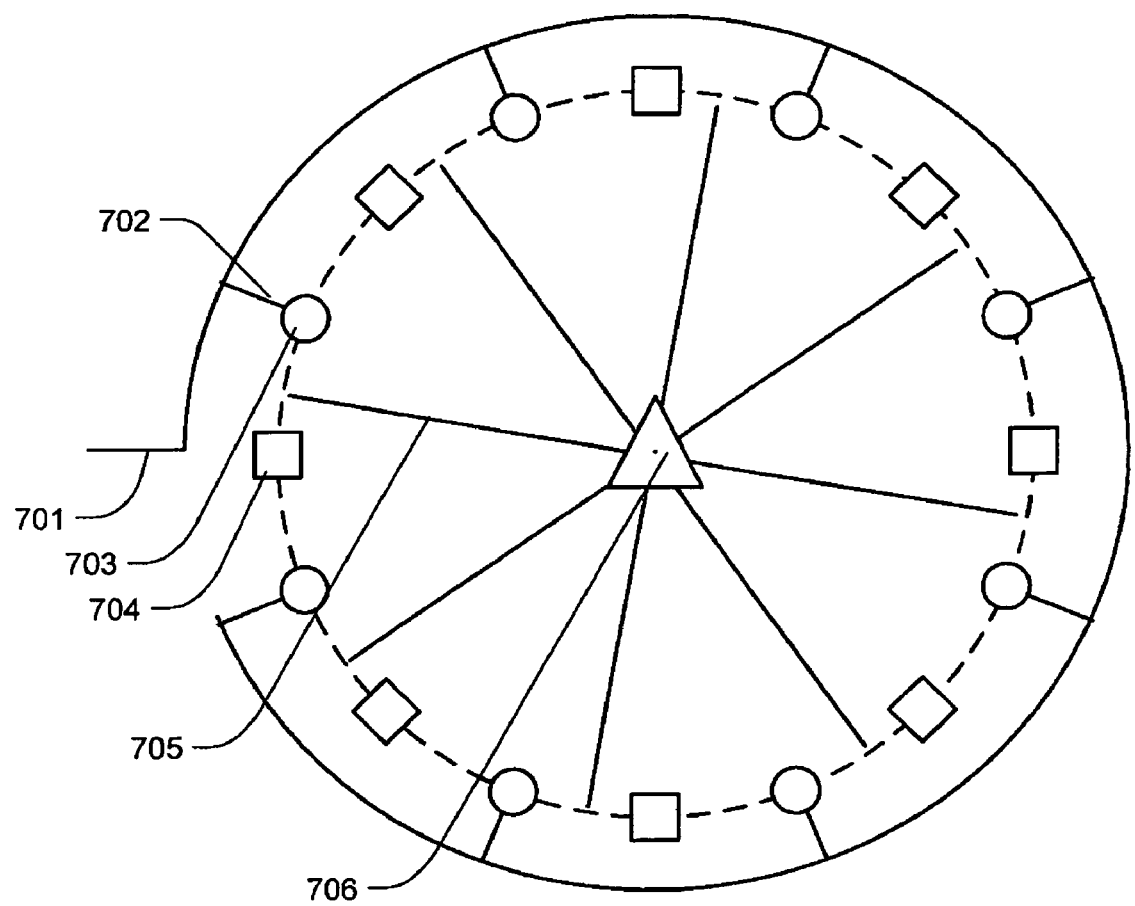
FIG. 7 depicts a ring logic embodiment.

FIG. 7 is a high level block diagram of a logic ring embodiment. A muti-bit input signal 701 is distributed 702 to a series of combinatorial logic blocks 703 that are indicated by circles. (Alternatively, a difference between input signals at t and t−1 can be calculated and distributed.) The squares 704 are Dtype logic blocks corresponding to elements of a circular ordered set. The spokes 705 are the D/A converters and the hub 706 combines the output of the D/A converters.

The combinatorial logic blocks 703 rotate a string among the Dtypes 704 and shortens or lengthens the string as appropriate. A difference in string length is calculated from the input signal 701, either in each block 703 or commonly for distribution 702 to all of the blocks. To handle rotation, a logic block can simply rotate a current D Type value one position clockwise. To lengthen a string by adding one to the tail, a logic block detects the tail by finding a bit set in the next position clockwise and a bit unset in the next position counter clockwise. It either sets the D Type in the counter clockwise position or inhibits the rotation of the unset bit from the counter clockwise position to the clockwise position, when the bit string rotates.

This embodiment requires substantially more gates to implement than the Verilog code of FIGS. 1A–1B. It produces good results without requiring feedback from the D/A converters 705 to the oversampling portion of the circuit that supplies the multi-bit input signal.

Some Particular Embodiments

The embodiments described may be practiced as a method or device adapted to practice the method. The embodiments also may be found in an article of manufacture such as machine readable media impressed with logic to carry out computer-assisted conversion of a multi-bit input signal to a pulse width modulated signal. Or, in a machine-readable media impressed with instructions to produce an integrated circuit adapted to carry out any of the methods or aspects described herein.

One embodiment is a converter responsive to a multi-bit input signal. This converter includes an input signal line carrying the multibit input signal, an input signal value buffer coupled to the input signal line and a first position indicator buffer, designating a first ordinal position a circularly ordered set having at least as many elements as there are allowable discrete values of the multi-bit input signal. The converter further includes first logic coupled to the first position indicator, adapted to periodically shift the ordinal position designated by the first position indicator and second logic coupled to the input signal line and to the input signal value buffer, adapted to calculate an input signal difference between the multi-bit input signal and a buffered prior input signal. The converter further includes third logic coupled to the second logic, adapted to adjust at least one of the first indicator or a second indicator designating a second ordinal position in the ordered set responsive to the input signal difference, wherein an indicator difference between the first and second ordinal positions corresponds to the value of the input signal. It also includes fourth logic coupled to the first and second position indicators, adapted to output signal having at least as many bits as there are allowable discrete values in the input signal, the bits corresponding to respective positions in the circularly ordered set, values of bits in the input signal responsive to a containment relationship between the first and second position indicators and the respective positions.

According to one aspect of this embodiment, the converter may further include the logic coupled to the input signal line, the input signal buffer and the first position indicator buffer, the logic adapted to synchronously update the input signal value buffer and the first position indicator buffer upon receipt of an updated multi-bit input signal. Another aspect further includes a plurality of single-bit digital-to-analog converters respectively coupled to the bits of the output signal, the D/A converters being responsive to the respective bits. A further aspect includes a summing element having an input coupled to the plurality of D/A converters and a sound output. The converter also may include a plurality of resistors respectively coupled through a plurality of output buffers to the bits of the output signal, the resistors being responsive to the respective bits. It may include a summing element having inputs coupled to the plurality of resistors and a summed output. A capacitor may, in turn, the coupled to the summed output, capacitively smoothing the summed output. The capacitively smoothed summed output can be measured to have a signal-to-noise ratio of 126 dB (A-weighted) or better.

In a further aspect of this embodiment, the periodic shift of the first logic follows a rotation pattern that reduces the frequency of transitions between high and low states for the bits of the output signal. Separately, the converter may further include an oversampling filter having an additional input and output, the oversampling filter coupled to the input signal line. This oversampling filled or may be a sigma delta modulator.

Another embodiment is a method of converting a multi-bit digital input signal into output signals from a plurality of D/A converters, using head and tail indicators, a difference between the indicators representing a value of the input signal, the head and tail indicators designating ordinal positions in an ordered set having at least as many elements as there are allowable discrete values of the input signal. This method includes calculating a difference in value between successive input signals and, responsive to the difference, updating at least one of the head indicator, the tail indicator or the difference between head and tail indicators. Each of the D/A converters being associated with respective set elements, the method further includes periodically shifting the association of the D/A converters with the respective set elements. It also may include generating output signals from a plurality of D/A converters, a particular output signal responsive to a containment relationship between the head and tail indicators and the respective set element.

One aspect of this embodiment further include maintaining at least one of the head and tail indicators as an index in a register. Alternatively, the head and tail indicators may be bits set in one or more shift registers. Or, at least one of the head and tail indicators may be a bit in a ring counter. In another implementation, the head and tail indicators may be bits in a ring logic structure.

In this method embodiment, the updating, periodically shifting and generating may all be accomplished on a single clock cycle, synchronously with receiving a new value of the input signal.

For completeness, we point out, in case the ordered set has a circular ordering, a containment relationship may be implemented as one of the following group: an element is contained by the head and tail indicators if it is between the ordinal positions designated by the head and tail indicators (before the head and after the tail); an element as contained by the head and tail indicators if it is between the ordinal positions designated by the head and tail indicators or in the position designated by the head indicator; an element as contained by the head and tail indicators if it is between the ordinal positions designated by the head and tail indicators or in the position designated by the tail indicator; or an element as contained by the head and tail indicators if it is between or in one of the ordinal positions designated by the head and tail indicators.

As in the converter embodiment, in this method embodiment, the shifting may follow a rotation pattern that reduces the frequency of transitions between high and low states for the D/A converters. The D/A converters may be resistors that generate an output signal ready for capacitive smoothing. The method may further include combining output signals and forming a combined continuous signal. Outputting the combined signal may result in a signal-to-noise ratio of 126 dB (A-weighted) or better. Alternatively, the D/A converters may be RC circuits. Combining the output of RC circuits may result in a signal-to-noise ratio of 126 dB (A-weighted) or better. The method may further include oversampling pulse code modulated signal to produce a multi-bit input signal.

A further method embodiment involves converting a multi-bit input signal into an output signal having as many positions as there are allowable values in the multi-bit input signal. This method uses head and tail indicators, a difference between the indicators representing a value the input signal, the head and tail indicators designating ordinal positions in an ordered set having at least as many elements as there are allowable discrete values of the input signal. The method includes calculating a difference in value between successive input signals and, responsive to the difference, updating at least one of the head indicator, the tail indicator, or the difference between head and tail indicators. In the method, the positions in the output signal are associated with respective set elements, the method including periodically shifting the association of the positions with the respective set elements. The method also includes generating the output signal, positions in the output signal responsive to a containment relationship between the head and tail indicators and the respective set elements.

Each of the aspects of the prior method embodiment may be applied to this method embodiment, with this embodiment potential including the additional step of generating signals from D/A converters associated with the respective positions of the output signal.

While the present invention is disclosed by reference to the preferred embodiments and examples detailed above, it is understood that these examples are intended in an illustrative rather than in a limiting sense. Computer-assisted processing is implicated in the described embodiments. It is contemplated that modifications and combinations will occur to those skilled in the art, which modifications and combinations will be within the spirit of the invention and the scope of the following claims.

We claim:

1. A method of converting a multi-bit digital input signal into output signals from a plurality of single-bit digital-to-analog (D/A) converters using head and tail indicators, a difference between the indicators representing a value of the input signal, the head and tail indicators designating ordinal positions in an ordered set having at least as many elements as there are allowable discrete values of the input signal, the method including:
    calculating a difference in value between successive input signals;
    responsive to the difference, updating at least one of the head indicator, the tail indicator, or the difference between head and tail indicators;
    each of the D/A converters being associated with respective set elements, periodically shifting the association of the D/A converters with the respective set elements; and
    generating output signals from the plurality of D/A converters, a particular output signal responsive to a containment relationship between the head and tail indicators and the respective set element.

2. The method of claim 1, further including maintaining at least one of the head and tail indicators as an index in a register.

3. The method of claim 1, wherein the head and tail indicators are bits set in one or more shift registers.

4. The method of claim 1, further including maintaining at least one of the head and tail indicators is a bit in a ring counter.

5. The method of claim 1, wherein the head and tail indicators are bits in a ring logic structure.

6. The method of claim 1, wherein the updating, periodically shifting and generating are all accomplished on a single clock cycle, synchronously with receiving new values of the input signal.

7. The method of claim 1, wherein the shifting follows a rotation pattern that reduces the frequency of transitions between high and low states for the D/A converters.

8. The method of claim 1, wherein the D/A converters are resistors, further including combining the output signals and capacitively smoothing the combined signal.

9. The method of claim 8, further including outputting the combined signal with a signal-to-noise ratio of 126 dB (A-weighted) or better.

10. A machine readable memory impressed with instructions to carry out the method of claim 1.

11. A machine readable memory impressed with instructions to produce an integrated circuit having logic and resources adapted to carry out the method of claim 1.

12. A method of converting a multi-bit input signal into an output signal having as many positions as there are allowable discrete values of the multi-bit input signal, using head and tail indicators, a difference between the indicators representing a value of the input signal, the head and tail indicators designating ordinal positions in an ordered set having at least as many elements as there are allowable discrete values of the input signal, the method including:

calculating a difference in value between successive input signals;

responsive to the difference, updating at least one of the head indicator, the tail indicator, or the difference between head and tail indicators;

the positions in the output signal being associated with respective set elements, periodically shifting the association of the positions with the respective set elements; and generating the output signal, positions in the output signal responsive to a containment relationship between the head and tail indicators and the respective set elements.

13. The method of claim 12, wherein the shifting follows a rotation pattern that reduces the frequency of transitions between high and low states for the positions in the output signal.

14. A machine readable memory impressed with instructions to carry out the method of claim 12.

15. A machine readable memory impressed with instructions to produce an integrated circuit having logic and resources adapted to carry out the method of claim 12.

* * * * *